United States Patent
Kawamoto (10) Patent No.: US 7,417,473 B2
(45) Date of Patent: Aug. 26, 2008

(54) SIGNAL GENERATOR INCLUDING CURRENT CONTROL ELEMENT AND SIGNAL FORMING ELEMENT FOR ACHIEVING LOW NOISE LEVEL AND LOW SWITCHING LOSS

(75) Inventor: Ippei Kawamoto, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 38 days.

(21) Appl. No.: 11/384,434

(22) Filed: Mar. 21, 2006

(65) Prior Publication Data

US 2006/0267665 A1    Nov. 30, 2006

(30) Foreign Application Priority Data

May 30, 2005 (JP) .............................. 2005-157689
Nov. 30, 2005 (JP) .............................. 2005-345839

(51) Int. Cl.
*H03K 3/00* (2006.01)
(52) U.S. Cl. ...................................... 327/108; 327/170
(58) Field of Classification Search ................. 327/108, 327/170
See application file for complete search history.

(56) References Cited

U.S. PATENT DOCUMENTS

| | | | |
|---|---|---|---|
| RE31,749 E * | 11/1984 | Yamashiro .................. 330/264 |
| 4,645,956 A * | 2/1987 | Shuey ......................... 327/318 |
| 4,648,019 A * | 3/1987 | Stahl ............................ 363/43 |
| 4,970,635 A * | 11/1990 | Shekhawat et al. ....... 363/56.01 |
| 6,288,582 B1 * | 9/2001 | Shigehara .................... 327/112 |
| 6,538,464 B2 * | 3/2003 | Muljono et al. ............... 326/27 |
| 6,545,513 B2 | 4/2003 | Tsuchida et al. |
| 6,570,413 B1 * | 5/2003 | Kumagai et al. ............ 327/108 |
| 7,098,703 B2 * | 8/2006 | Harvey ........................ 327/111 |

FOREIGN PATENT DOCUMENTS

| EP | 340731 | * 8/1989 | .................. 326/27 |
|---|---|---|---|
| JP | 58-12401 | * 1/1983 | ................. 327/129 |

* cited by examiner

*Primary Examiner*—Kenneth B. Wells
(74) *Attorney, Agent, or Firm*—Posz Law Group, PLC (57) ABSTRACT

A signal generator includes: a current control element for controlling a current flowing through an electric load; and signal forming means for outputting a control signal to the current control element. The signal forming means generates the control signal in such a manner that the current flowing through the electric load has a rising edge and a down edge of a substantially sine waveform. The rising edge of the current is disposed at a timing when the current control element is switched on. The down edge of the current is disposed at a timing when the current control element is switched off.

4 Claims, 9 Drawing Sheets

SIGNAL GENERATOR INCLUDING CURRENT CONTROL ELEMENT AND SIGNAL FORMING ELEMENT FOR ACHIEVING LOW NOISE LEVEL AND LOW SWITCHING LOSS

CROSS REFERENCE TO RELATED APPLICATIONS

This application is based on Japanese Patent Applications No. 2005-157689 filed on May 30, 2005, and No. 2005-345839 filed on Nov. 30, 2005, the disclosures of which are incorporated herein by reference.

FIELD OF THE INVENTION

The present invention relates to a signal generator.

BACKGROUND OF THE INVENTION

A signal generator outputs a current signal having a predetermined waveform in accordance with electric load or forms and outputs a signal for communication (i.e., a communication signal) on the basis of a direct current power supply. For example, when the electric load such as a lamp and a coil mounted in an automotive vehicle is operated or stopped operating, a noise is generated by rapid current change at the moment when electricity is turned on or off. The noise may harm a radio and a control circuit mounted on the vehicle. Specifically, the impedance of the electric load is changed by heat together with energization. The impedance is low just after the electricity starts to be supplied to the electric load. At this time, the current change is greater than that of a case when the electricity is energized constantly. To reduce the noise, a signal generator is disclosed in U.S. Pat. No. 6,545,513-B2. In the signal generator, current waveform during PWM control is set to be a trapezoid form so that current change at the moment of energization or de-energization becomes moderate. Thus, the noise level is reduced by the signal generator.

To reduce the noise level, it is preferred that a slope at a rising edge and a down edge of the current waveform becomes smaller. However, when the slope becomes small, a switching device such as a FET may generate large heat because a switching loss in the device increases. Thus, it is required to select the switching device having sufficient thermal resistance for withstanding the large heat and/or to prepare a heat sink for radiating the large heat. Therefore, a manufacturing cost is increased, and design freedom of the signal generator is reduced. Further, it is required to reduce noise in the switching device not only for the electric load but also for a communication by slowing a slope at a rising edge and a down edge in a current waveform.

SUMMARY OF THE INVENTION

In view of the above-described problem, it is an object of the present invention to provide a signal generator with low noise and low switching loss.

A signal generator includes a current control element for controlling a current flowing through an electric load, wherein the current control element is disposed between a direct current power supply and the electric load; and signal forming means for outputting a control signal to the current control element. The signal forming means generates the control signal in such a manner that the current flowing through the electric load has a rising edge and a down edge of a substantially sine waveform. The rising edge of the current is disposed at a timing when the current control element is switched on. The down edge of the current is disposed at a timing when the current control element is switched off.

In the above generator, the signal forming means outputs the control signal in such a manner that the current form of the current flowing through the electric load has a slope at the starting point and the end point in the rising edge and at the starting point and the end point in the down edge, the slope which smoothly changes with time. The rising edge and the down edge of the current appear at a timing when the current control element switches to turn on and off. Here, the slope with smoothly changing with time means that the waveform includes no rapid variation point, which is in differentiable with respect to time. Thus, the signal forming means generates the control signal having the waveform including no in differentiable variation point, so that the current control element is switched by the control signal. In this case, the generator achieves low noise level and low switching loss.

Further, a signal generator includes: a signal output element for generating and outputting a communication signal by means of a direct current power supply; and signal forming means for outputting a control signal to the signal output element. The signal forming means generates the control signal in such a manner that the communication signal has a smooth changing slope at a starting point and an ending point in a rising edge and at a starting point and an ending point in a down edge. The rising edge of the communication signal is disposed at a timing when the signal output element starts outputting. The down edge of the communication is disposed at a timing when the signal output element stops outputting.

In the above generator, the signal forming means outputs the control signal in such a manner that the waveform of the communication signal has a slope at the starting point and the end point in the rising edge and at the starting point and the end point in the down edge, the slope which smoothly changes with time. The rising edge and the down edge of the communication signal appear at a timing when the signal output element starts to output and stops to output. Here, the slope with smoothly changing with time means that the waveform includes no rapid variation point, which is in differentiable with respect to time. The signal output element outputs the communication signal for communication on the basis of the direct current power source. Thus, when the signal output element transmits the communication signal, which is changeable between the high level and the low level, a higher harmonic component in the communication signal can be eliminated, so that noise such as excess radiation is reduced. In this case, the generator achieves low noise level and low switching loss between the high level and the low level.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
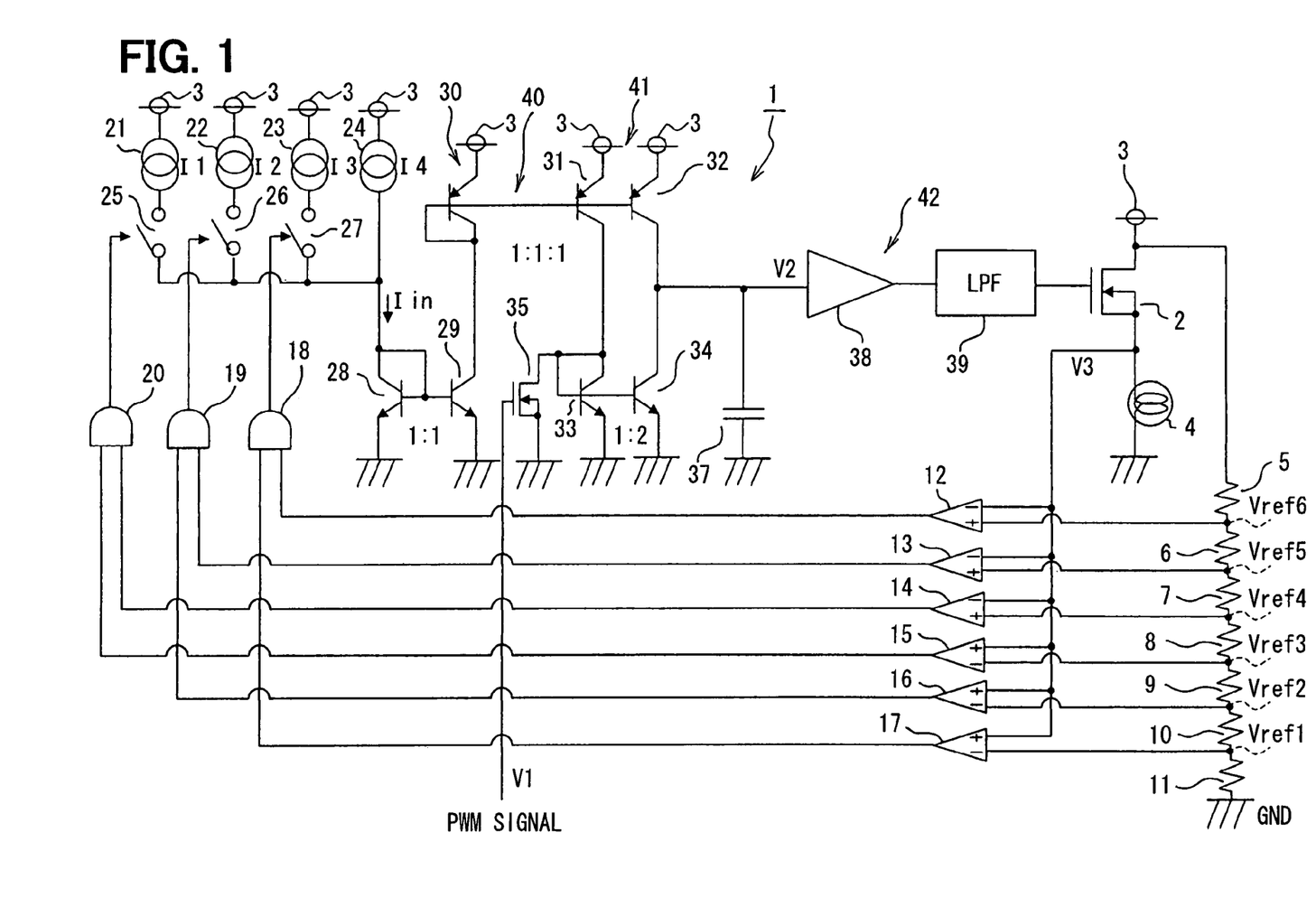
FIG. 1 is an electric diagram showing a driving device according to a first embodiment of the present invention.

A signal generator according to a first embodiment of the present invention is shown in FIGS. 1 to 5B. The signal generator is suitably used for a driving device, which operates a lamp of an automotive vehicle as an electric load. The electric diagram of the driving device 1 as the signal generator is shown in FIG. 1. In the driving device 1, a drain of a N channel MOSFET 2 as a current control element connects to a battery 3 as a direct current power source of an automotive vehicle, and a source of the MOSFET 2 connects to a ground through a lamp 4 as the electric load. Here, a FET represents the MOSFET, and a transistor represents a bipolar transistor.

Multiple resistors 5-11 connect in series between the battery and the ground GND. A connection point between two neighboring resistors 5-11 generates a reference voltage Vref1-Vref6, respectively. Each reference voltage Vref4-Vref6 is inputted into a non-inverting input terminal of a comparator 12-14, and each reference voltage Vref1-Vref3 is inputted into an inverting input terminal of a comparator 15-17, respectively. The inverting input terminal of each comparator 12-14 and the non-inverting input terminal of each comparator 15-17 are commonly connected to a source of the MOSFET 2.

An output terminal of each comparator 12, 17 is connected to an input terminal of an AND gate 18, an output terminal of each comparator 13, 16 is connected to an input terminal of an AND gate 19, and an output terminal of each comparator 14, 15 is connected to an input terminal of an AND gate 20, respectively. One end of each of four constant current power sources 21-24 is connected to the battery 3. The constant current power source 21-24 generates a predetermined constant current I1-I4. The other end of each of the constant current power sources 21-23 is connected to a collector of a NPN transistor 28 through a switch 25-27, respectively. The other end of the constant current power source 24 is directly connected to the collector of the NPN transistor 28 without a switch. Each switch 25-27 is an analog switch, and the switch 25-27 is controlled to open and to close by the output signal of the AND gate 18-18, respectively.

The NPN transistor 28 and another NPN transistor 29 provide a mirror pair having a current ratio of 1:1. The emitter of each of the transistors 28, 29 is grounded, and the base of each transistor 28, 29 is connected to the collector of the transistor 28. The emitter and the collector of a PNP transistor 30 are connected between the battery 3 and the collector of the transistor 29. Other two PNP transistors 31, 32 and the PNP transistor 30 provide a current mirror circuit having a current ration of 1:1:1. The emitters in the transistors 31, 32 are connected to the battery 3. The base of each transistor 30-32 is connected to the collector of the transistor 30.

The collector of each transistor 31, 32 is connected to the collector of each NPN transistor 33, 34, respectively. The transistors 33, 34 provide a mirror pair having a current ratio of 1:2. The emitter of each transistor 33, 34 is grounded, and the base of each transistor 33, 34 is connected to the collector of the transistor 33. An N channel MOSFET 35 is connected in parallel with the transistor 33. A PWM signal is inputted from an external circuit to the gate of the MOSFET 35. Thus, when the PWM signal shows a high level, the MOSFET 35 turns on.

The collector of each transistor 32, 34 is connected to the ground through a capacitor 37. Further, the collector of the transistor 32, 34 is connected to the gate of the MOSFET 2 through a low pass filter (i.e. LPF) 39 and a buffer 38 for driving the gate.

The transistors 28-34 and the MOSFET 35 provide a constant current power supply 40. Further, the resistors 5-11, the comparators 12-17, the AND gates 18-20, the constant current power supplies 21-24, the switches 25-27 and the capacitor 37 provide approximate waveform forming means 41. Furthermore, the approximate waveform forming means 41 and the low pass filter 39 provide signal forming means 42.

Figure 2A:
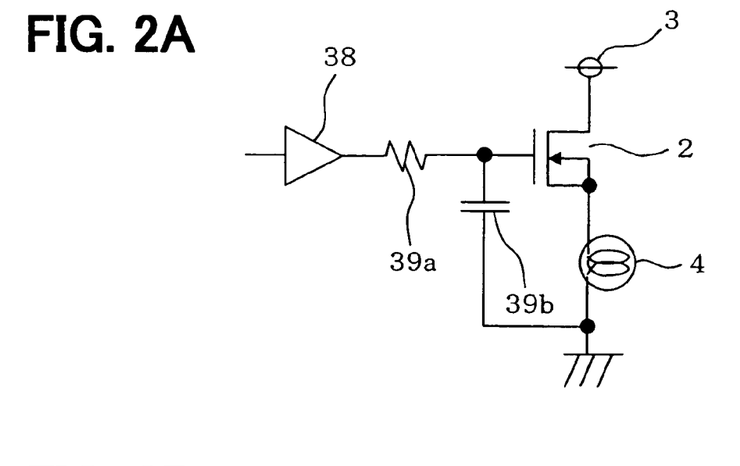
FIGS. 2A to 2C are electric diagrams showing three different low pass filters in the device according to the first embodiment.
Figure 2B:
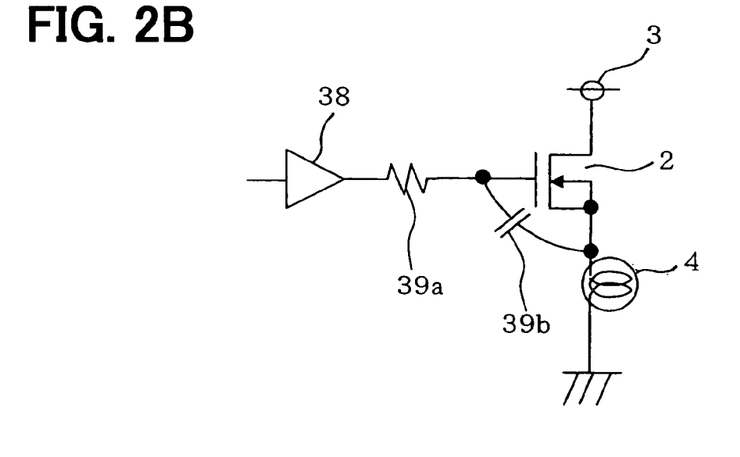
Figure 2C:
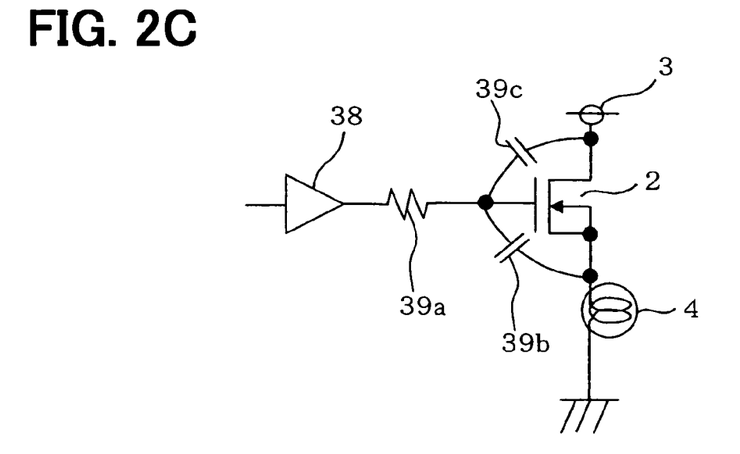

FIGS. 2A to 2C show three examples of the low pass filter 39. Each filter 39 is formed of a RC filter. The low pass filter 39 may be formed of a higher order active filter. Even when the low pass filter 39 is formed of a first order passive filter, the filter 39 can provide sufficient functions. However, when a time constant of the filter 39 is large, a switching interval becomes long, so that a switching loss becomes larger. This is because a shape of waveform of the control signal is lost although the noise is reduced effectively. Accordingly, it is required to determine the time constant in view of considering reduction of the noise and reduction of the switching loss. Further, when deviation of the capacitance in the MOSFET 2 is comparatively large, a resistance is set to be smaller, and a capacitance is set to be larger.

In FIG. 2A, a resistor 39a and a capacitor 39b are connected between the gate of the MOSFET 2 and the ground. In FIG. 2B, a terminal of the capacitor 39b disposed on the ground side is connected to the source of the MOSFET 2. In this case, a starting point of a rising edge and a starting point of a down edge in the control signal becomes moderate without substantially changing a slope of a portion of the waveform at the maximum angle of the slope in the rising edge and the down edge. In FIG. 2C, another capacitor 39c is connected between the gate and the drain of the MOSFET 2.

Figure 3:
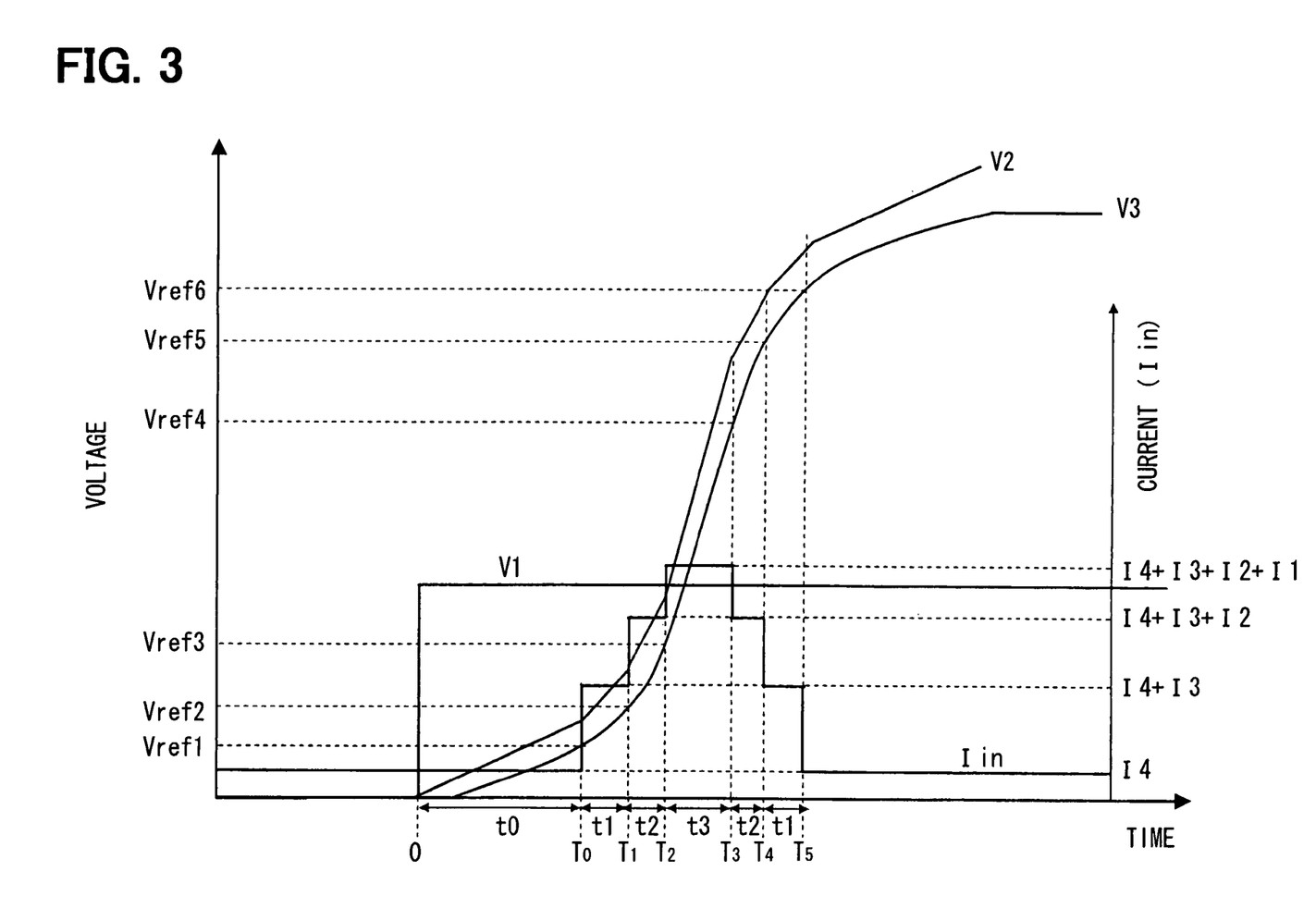
FIG. 3 is a graph showing a sine wave signal in a rising edge of a PWM signal, according to the first embodiment.

FIG. 3 shows a waveform in the driving device 1. A sine curve signal is outputted at the rising edge of the PWM signal. Here, V1 represents the PWM signal, V2 represents a pseudo-sine wave, and V3 represents a driving voltage for a load. Voltages Vref1 to Vref6, currents I1 to I4 and times t0 to t3 have the following relationship.

$$Vref1/t0 = I4/C \quad (F1)$$

$$(Vref2-Vref1)/t1 = (I4+I3)/C \quad (F2)$$

$$(Vref3-Vref2)/t2 = (I4+I3+I2)/C \quad (F3)$$

$$(Vref4-Vref3)/t3 = (I4+I3+I2+I1)/C \quad (F4)$$

$$Vref3-Vref2 = Vref5-Vref4 \quad (F5)$$

$$Vref2-Vref1 = Vref6-Vref5 \quad (F6)$$

The pseudo-sine wave V2 is a terminal voltage of the capacitor 37, and the driving voltage V3 is a terminal voltage of the lamp 4 as an output voltage. In the initial state, when the terminal voltage V2 of the capacitor 37 and the terminal voltage V3 of the lamp 4 are at a ground potential level, the output signal of each comparator 12-14 shows a high level, and the output signal of each comparator 12-14 shows a low level. Accordingly, each switch 25-27 is in an off state. The input current Iin flowing into the transistor 28 shows a constant current I4 of the constant current power supply 24.

When the PWM signal is in the low level, the MOSFET 35 is in an off state. Thus, the current mirror circuit composed of the transistors 33, 34 is operated, and the transistor 34 flows the current of 2×I4, i.e., double of I4.

When the PWM signal switches from this initial state to the high level, the MOSFET 35 turns on, and the current mirror circuit stops to operate. At this time, the time is defined as zero. Then, the capacitor 37 is charged up with the constant current I4. Therefore, the terminal voltage V2 of the capacitor 37 increases linearly. Further, the gate voltage of the MOSFET 2 also increases through the buffer 38 and the low pass filter 39. Accordingly, the driving current is supplied to the lamp 4. Thus, the terminal voltage V3 of the lamp 4 starts to increase with a delay from the voltage V2. The delay is equal to the time constant of the low pass filter 39.

When the terminal voltage V3 of the lamp 4 exceeds a first reference voltage Vref1, the output voltage of the comparator 17 becomes the high level, and the switch 27 turns on through the AND gate 18. At this time, the time shows T0=t0. Then, the input current Iin flowing into the transistor 28 changes from the constant current I4 to I4+I3, so that the input current Iin increases. Thus, the degree of increase in the terminal voltage V2 of the capacitor 37 becomes larger. Specifically, the slope of the voltage V2 in the range between T0 and T1 becomes larger than that in the range between zero and T0.

In general, when a capacitance of a capacitor is defined as C, a terminal voltage is defined as V, and a charge is defined as Q, the following relationship is obtained.

$$V = Q/C \quad (F7)$$

Both sides of the above formula are differentiated with respect to time, so that the following formula is obtained.

$$dV/dt = (dQ/dt)/C = I/C \quad (F8)$$

Accordingly, the degree of increase in the terminal voltage V2 during the time interval to is obtained as follows.

$$Vref1/t0 = I4/C \quad (F9)$$

Therefore, the degree of increase is determined by the capacitance of the capacitor 37 and the constant current I4 of the constant current power supply 24. Here, since the constant current I4 is constant, the terminal voltage V2 increases linearly.

Then, both terminal voltages V2, V3 increase moreover. When the terminal voltage V3 exceeds a second reference voltage Vref2, the output signal of the comparator 16 becomes high level, and the switch 26 turns on through the AND gate 19. At this time, the time is T1=t0+t1. Then, the input current Iin flowing into the transistor 28 increases to I4+I3+I2. Thus, the degree of increase in the terminal voltage V2 of the capacitor 37 becomes much larger. Similarly, when the terminal voltage V3 exceeds a third reference voltage Vref3, the switch 25 turns on at the time of T2=t0+t1+t2. Then, the input current Iin flowing into the transistor 28 increases to I4+I3+I2+I1. Thus, the degree of increase in the terminal voltage V2 of the capacitor 37 shows the largest degree.

After a predetermined time has passed, the terminal voltage V3 exceeds a fourth reference voltage Vref4. At this time of T3=t0+t1+t2+t3, the output signal of the comparator 14 becomes low level, and the switch 25 turns off through the AND gate 20. Then, the input current Iin flowing into the transistor 28 decreases to I4+I3+I2. The degree of increase in the terminal voltage V2 of the capacitor 37 becomes smaller so that the degree in the range of the time between T3 and T4 is equal to that between T1 and T2.

Further, when a predetermined time has passed, the terminal voltage V3 exceeds a fifth reference voltage Vref5. At this time of T4=t0+t1+t2+t3+t4, the output signal of the comparator 13 becomes low level, and the switch 26 turns off. Then, the input current Iin decreases to I4+I3. The degree of increase in the terminal voltage V2 in the range of the time between T4 and T5 is equal to that between T0 and T1. Furthermore, when the terminal voltage V3 exceeds a sixth reference voltage Vref6 at the time of T5=t0+t1+t2+t3+t4+t5, the output signal of the comparator 12 becomes low level, and the switch 27 turns off. Then, the input current Iin decreases to I4 with the degree of increase in the terminal voltage V2 after the time of T5 equal to that between zero and T0.

As a result of the above operation, the terminal voltage V2 of the capacitor 37 in the rising edge period of the PWM signal shows a voltage waveform of a pseudo-sine wave, which is obtained by approximating the sine wave by a polygonal line. The pseudo-sine wave of the terminal voltage V2 passes through the low pass filter 39, so that the gate voltage waveform of the MOSFET 2 much approaches the sine wave.

Although the terminal voltage V2 in the down edge period of the PWM signal is not shown in FIG. 3, the capacitor 37 starts to discharge when the MOSFET 35 turns off. In this case, the input current Iin flowing into the transistor 28 changes along with a process opposite to the process shown in FIG. 3. Specifically, the input current Iin firstly increases from I4 to I4+I3+I2+I1, and then, decreases from I4+I3+I2+I1 to I4. Thus, the discharge current waveform in the down edge period shows a pseudo-sine waveform, which is obtained by approximating the sine wave by a polygonal line. Specifically, the discharge current waveform of the input current Iin in the down edge period is symmetric to the charge current waveform of the input current Iin in the rising edge period.

Figure 4:
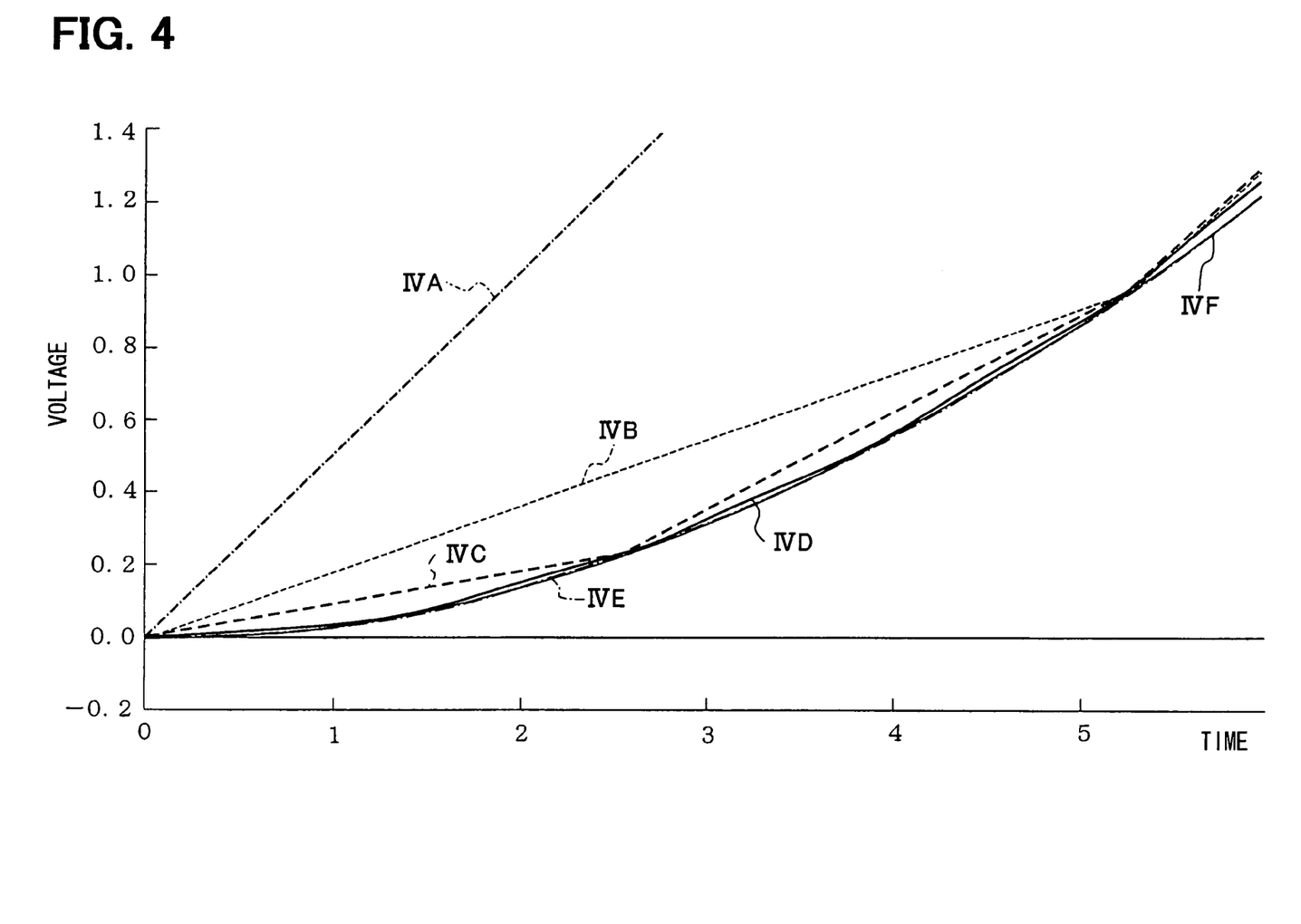
FIG. 4 is a graph showing a simulation result of waveforms formed by a broken line approximation, a trapezoid wave and a complete sine wave, according to the first embodiment.

Although the current waveform of the input current Iin is obtained by approximating the sine wave by the polygonal line having six node points, the current waveform may be obtained by approximating the sine wave by other polygonal lines. For example, in FIG. 4, the input current Iin is obtained by the broken line approximation having five node points, ten node points, twenty node points or thirty node points. FIG. 4 is a simulation result of the input current Iin. In FIG. 4, IVA represents a conventional trapezoid waveform, IVB represents the broken line approximation of five node points, IVC represents the broken line approximation of ten node points, IVD represents the broken line approximation of twenty node points, IVE represents the broken line approximation of thirty node points, IVF represents the complete sine waveform. As the number of the node points increases, the current waveform of the input current Iin approaches the complete sine waveform.

Figure 5A:
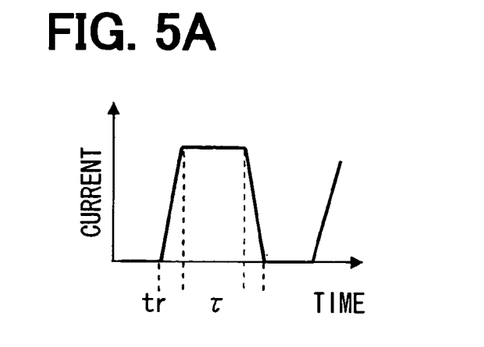
FIG. 5A is a graph showing a conventional trapezoid wave signal.
Figure 5B:
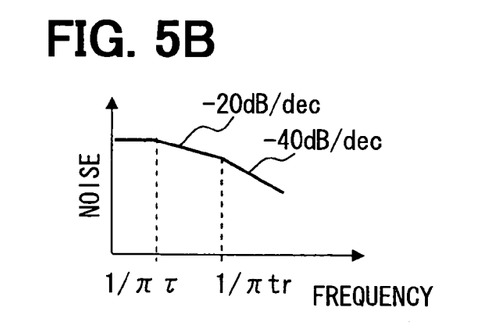
FIG. 5B is a graph showing a relationship between a noise level and frequency in case of the trapezoid wave signal.
Figure 5C:
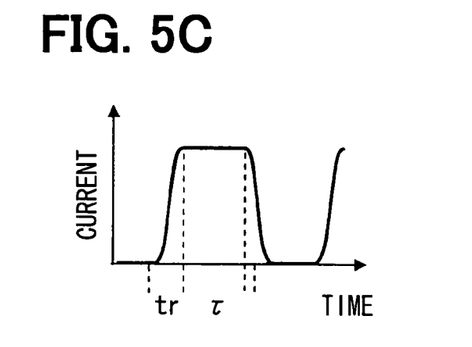
FIG. 5C is a graph showing a sine wave signal.
Figure 5D:
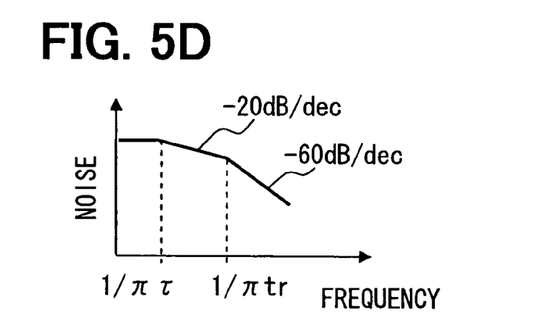
FIG. 5D is a graph showing a relationship between a noise level and frequency in case of the sine wave signal, according to the first embodiment.

FIGS. 5A and 5B represent a case of the conventional trapezoid waveform in the rising edge period and in the down edge period, and FIGS. 5C and 5D represent a case of the sine waveform in the rising edge period and in the down edge period. Each of FIGS. 5B and 5D shows a relationship between noise level and frequency, which is obtained by a simulation result. In FIGS. 5A and 5C, tr represents a time length of the rising edge period and the down edge period, and r represents a time length when the PWM signal is high level. As shown in FIG. 5B, the noise level of the conventional trapezoid waveform is decreased together with −40 dB/dec in a range where the frequency is equal to or larger than $1/\pi \cdot tr$. However, in FIG. 5D, the noise level of the sine waveform is decreased together with −60 dB/dec in a range where the frequency is equal to or larger than $1/\pi \cdot tr$. Thus, the noise level of the sine waveform is much reduced, compared with the conventional trapezoid waveform.

The signal forming means 42 in the driving device 1 forms the PWM signal having the approximately sine waveform in the rising edge period and the down edge period. The PWM signal controls to switch the MOSFET 2, and the MOSFET 2 controls the current flowing through the lamp 4. Thus, the signal forming means 42 forms the PWM signal having gentle slopes at the beginning of the rising edge, at the end of the rising edge, at the beginning of the down edge and at the end of the down edge, and outputs the PWM signal to the MOSFET 2.

Specifically, the approximate waveform forming means 41 charges the capacitor 37 in the rising edge period of the PWM signal, and discharges the capacitor 37 in the down edge period. Thus, the degree of increase in the terminal voltage V2 and the degree of decrease in the terminal voltage V2 are switched in multiple steps so that the approximate sine waveform signal is obtained by the broken line approximation. Then, the approximate sine waveform signal is outputted through the low pass filter 39. Accordingly, the load current waveform of the load current flowing through the lamp 4 has the rising edge of the approximate sine waveform and the down edge of the approximate sine waveform, so that the noise level is reduced. Further, the switching loss of the MOSFET 2 is also reduced.

The approximate waveform forming means 41 switches the degree of increase and the degree of decrease in the terminal voltage V2 by connecting and disconnecting between the capacitor 37 and the constant current power supplies 21-24 and the constant current power supply 40 for discharge. Therefore, the current for charging and discharging the capacitor 37 is easily controlled. Further, the approximate waveform forming means 41 controls to connect and to disconnect multiple constant current power supplies 21-23 in accordance with the output signals of the comparators 12-17, each of which compares the terminal voltage of the lamp 4 and the corresponding reference voltage Vref1-Vref6. Thus, the approximate sine waveform signal is generated by controlling the timing of connect and disconnect.

Additionally, the constant current power supply 40 for discharge is connected in parallel to the capacitor 37. The power supply 40 is capable of flowing the current twice larger than the total current, which is outputted from multiple constant current power supplies 21-24 to the capacitor 37. The approximate waveform forming means 41 controls the power supply 40 to be active when the PWM signal shows the low level. Thus, it is no need for forming the waveform in the down edge period to prepare the additional constant current power supplies, since the current power supplies for forming the waveform in the down edge period is in common with the current power supplies for forming the waveform in the rising edge period. Thus, the number of the current power supplies for proving the approximate waveform forming means 41 is minimized.

Although the transistor is the MOSFET 2, the transistor may be a P channel MOSFET, a power transistor or an IGBT. Further, although the electric load is the lamp 4, the load may be other load as long as the electric load is operated by direct current. For example, the electric load may be a DC motor or a solenoid. Furthermore, the electric load may be a load for other equipment other than an automotive vehicle.

Although a control signal for controlling the transistor to switch on and off is formed on the basis of the PWM signal, the control signal may be formed on the basis of other signal as long as the control signal has a smooth slope at the starting point and the end point in the rising edge and in the down edge. For example, the control signal is formed in such a manner that the rising edge and the down edge have a sine waveform.

Second Embodiment

Figure 6:
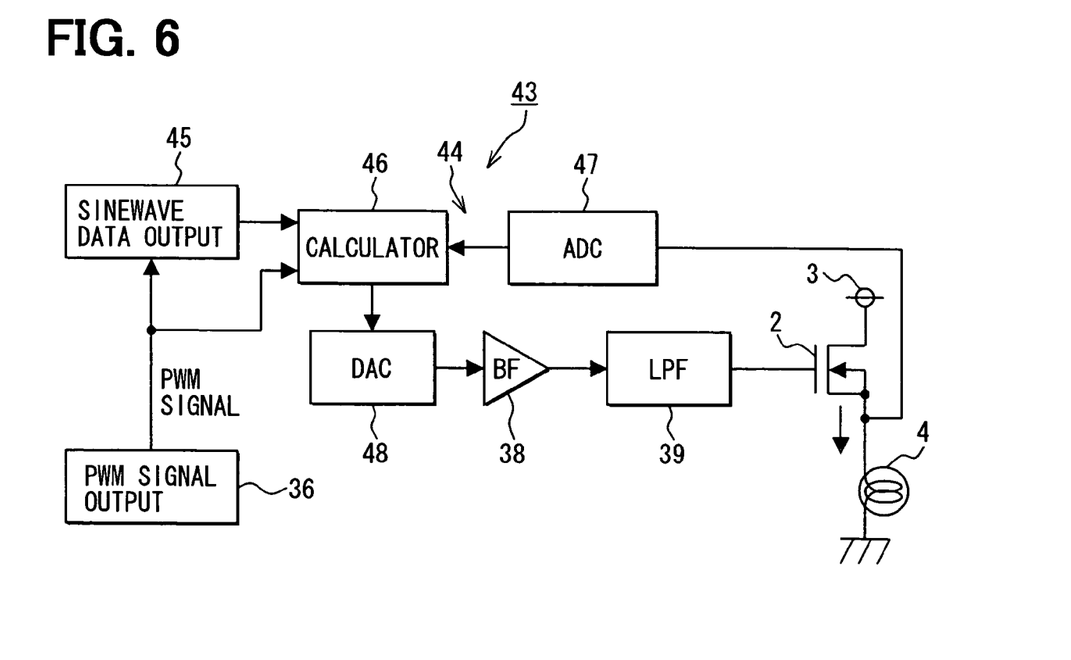
FIG. 6 is an electric diagram showing a driving device according to a second embodiment of the present invention.

FIGS. 6 and 7 show a driving device 43 according to a second embodiment of the present invention. The driving device 43 includes signal forming means 44 on an input side of the buffer 38 in the driving device 1 in FIG. 1. The signal forming means 44 includes an ideal sine wave data output portion 45 as a reference data output portion, a sine wave information calculation portion 46, A/D converter 47 as voltage detecting means, and D/A converter (i.e., DAC) 48.

The ideal sine wave data output portion 45 includes a memory for memorizing the sine wave data. An address counter in the ideal sine wave data output portion 45 is operated in accordance with a trigger from a PWM signal output portion 36. The ideal sine wave data output portion 45 reads the sine wave data corresponding to an address of the address counter, so that the ideal sine wave data output portion 45 outputs the sine wave data to the sine wave information calculation portion 46. The A/D converter 47 converts the terminal voltage of the lamp 4 with A/D conversion, and then, the converter 47 outputs the converted terminal voltage to the sine wave information calculation portion 46. The sine wave information calculation portion 46 processes and calculates both data of the converted terminal voltage and the sine wave data so that the sine wave data corresponding to the rising edge period and the down edge period in the PWM signal is generated. The sine wave data is outputted to the D/A converter 48. The analog voltage signal obtained by the D/A converter 48 by the D/A conversion is outputted to the buffer 38.

FIG. 7 shows an inner construction of the sine wave information calculation portion 46, and a waveform in each part in the portion 46. The sine wave information calculation portion 46 includes a rising edge calculation circuit 46U and a down edge calculation circuit 46D. The rising edge calculation circuit 46U generates the sine wave data corresponding to the rising edge period, and the down edge calculation circuit 46D generates the sine wave data corresponding to the down edge period. The functions of the rising edge calculation circuit 46U are explained as follows.

Figure 7A:
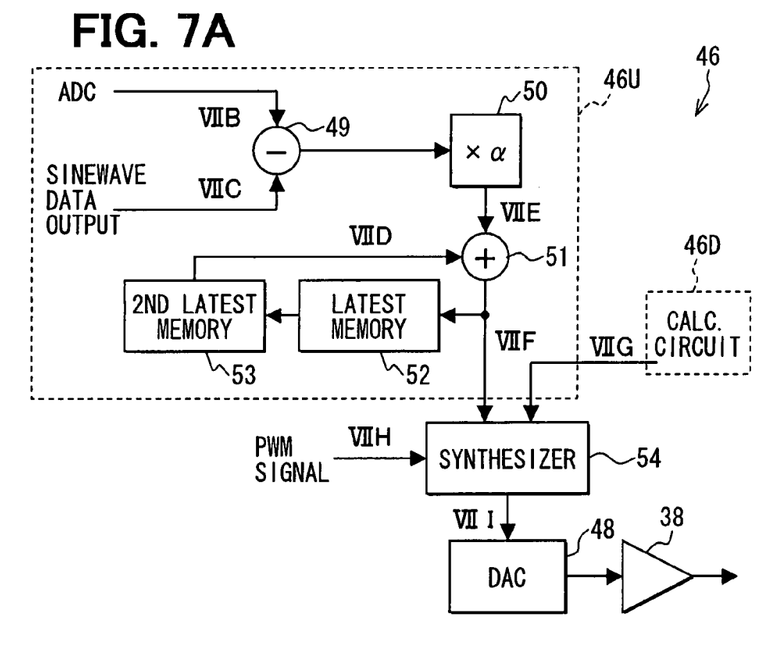
FIG. 7A is an electric diagram showing a sine wave information calculation portion in the driving device according to the second embodiment.
Figure 7B:
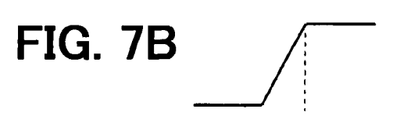
FIGS. 7B to 7I are graphs showing a signal waveform in each part of the sine wave information calculation portion.
Figure 7C:
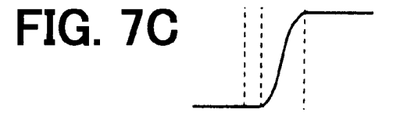

The output data of the A/D converter 47 and the output data (i.e., the reference data) of the ideal sine wave data output portion 45 are inputted to a subtractor 49 so that a difference data between both data is obtained and outputted. A multiplier 50 multiplies the difference data by a factor $\alpha$, and then, outputs the multiplied difference data to an adder 51. The output data outputted from the adder 51 is sequentially memorized in a latest data storage memory 52 and in a second latest data storage memory 53 in each calculation cycle. The adder 51 adds the data memorized in the second latest data storage memory 53 and the output data outputted from the multiplier 50. The output data outputted from the adder 51 to a rising/down edge waveform synthesis portion 54.

The down edge calculation circuit 46D generates and outputs the sine wave data corresponding to the down edge period in the PWM signal, similar to the rising edge calculation circuit 46U. The rising/down edge waveform synthesis portion 54 synthesizes the output data from the adder 51 in such a manner that the output data from the rising edge calculation circuit 46U and the down edge calculation circuit 46D is equal to the DUTY of the PWM signal. Then, the synthesized output data is outputted to the D/A converter 48. Here, the factor $\alpha$ may be "1." When the gate voltage inputted to the MOSFET 2 becomes excess so that the MOSFET 2 may be oscillated, the factor $\alpha$ is set to be smaller than "1," i.e., $\alpha<1$.

Figure 7D:
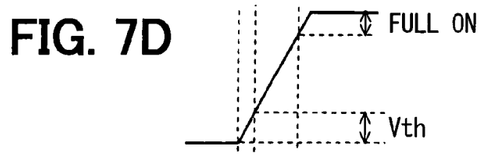
Figure 7E:
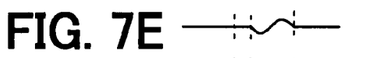
Figure 7F:
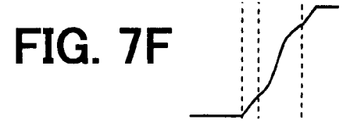
Figure 7G:
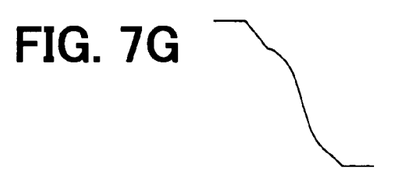
Figure 7H:
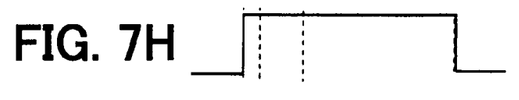
Figure 7I:
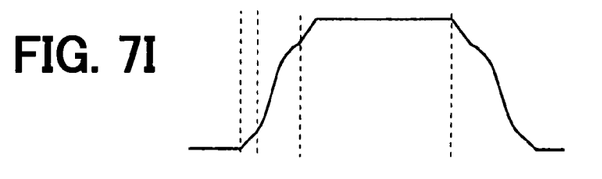

The sine wave information calculation portion 46 performs the above data processing. The signal waveforms VIIB to VIIH in each part in the sine wave information calculation portion 46 is shown in FIGS. 7B to 7H, respectively. The final output waveform VII outputted from the sine wave information calculation portion 46 is shown in FIG. 7I. Here, the timing of the rising edge in the waveform VIIB is deviated from that in the waveform VIID. Further, the timing of saturation to the high level in the waveform VIIB is deviated from that in the waveform VIID. This is because the MOSFET 2 actually turns on at a time when the gate voltage exceeds the threshold voltage Vth. Accordingly, the waveform VIIH of the PWM signal coincides with the waveform VIID of the second latest data storage memory 53. Further, a state where the MOSFET 2 turns on corresponds to a portion to be added to the gate signal in order to reduce the switching loss by putting into a low on-state resistance. The deviation shown as Vth in FIG. 7D and the deviation shown as FULL ON in FIG. 7D are preliminarily determined and memorized in the memories 52, 53 as an initial value.

In the signal forming means 44 in the driving device 43, the data is obtained by converting the terminal voltage of the lamp 4 with A/D conversion. The difference between the data and the reference data including the sine wave data corresponding to the rising edge period or the down edge period is calculated. The difference data is added to the output data, which is obtained in a previous calculation cycle. This result data is outputted in such a manner that the result data is synchronized to the PWM signal. The output data is converted with the D/A conversion, and then the converted output data is filtered through the low pass filter 39. Thus, the waveform of the PWM signal in the rising edge period and in the down edge period becomes the complete sine waveform. Further, the factor $\alpha$ in the multiplier 50 can be set to be smaller than "1" if necessary. In this case, the data level to be outputted to the adder 51 is limited, so that oscillation is prevented from occurring.

Although the device includes the multiplier 50, the device may include no multiplier 50 if appropriately. Further, although the device includes the low pass filter 39, the device may include no low pass filter 39 if appropriately.

Third Embodiment

Figure 8:
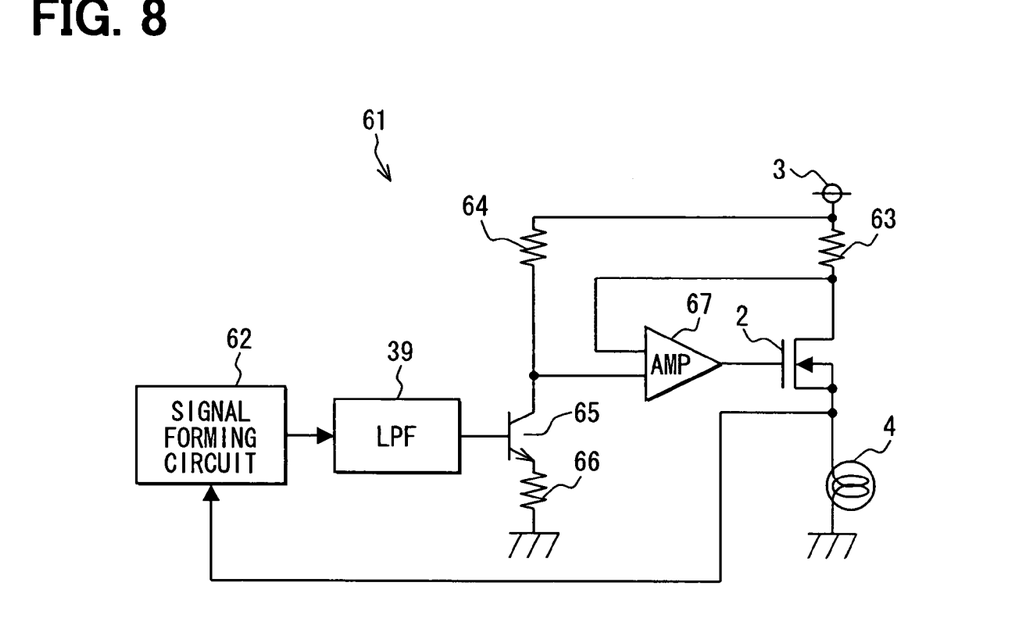
FIG. 8 is an electric diagram showing a driving device according to a third embodiment of the present invention.

FIG. 8 shows a driving device as a signal generator 61 according to a third embodiment of the present invention. A sine wave forming circuit 62 outputs a sine wave signal, and the signal generator 61 inputs the sine wave signal to a low pass filter 39. The sine wave forming circuit 62 may be the approximate waveform forming means 41 in FIG. 1 or the signal forming means 44 in FIG. 6 other than the low pass filter 39.

A resistor 63 as a current detection resistor is formed between the battery 3 and the drain (i.e., a terminal on a power supply side) of the MOSFET 2. The battery 3 is connected to the ground through a resistor 64, a NPN transistor 65 and another resistor 66. The base of the transistor 65 is connected to the output terminal of the low pass filter 39. The drain of the MOSFET 2 and the collector of the transistor 65 are connected to the input terminals of an operational amplifier 67 as current control means. The output terminal of the operational amplifier 67 is connected to the gate of the MOSFET 2.

The operational amplifier 67 functions as current control means, so that the current flowing through the lamp 4 is controlled to equalize the electric potential of the drain in the MOSFET 2 and the electric potential of the collector in the transistor 65. In the device shown in FIGS. 1 and 6, the driving current in the device is changed when the load is changed. Therefore, when the load becomes smaller, the driving current becomes larger, so that the noise level becomes larger. Specifically, when the load is the lamp 4 as an inductive load, a rush current flows just after the lamp 4 turns on. Thus, the noise level becomes larger. However, in the device shown in FIG. 8, the operational amplifier 67 controls the current in such a manner that the current flowing through the lamp 4 is determined by a ratio between the resistances of the resistors 63, 64.

Further, when the low pass filter 39 is formed on the output side of the operational amplifier 67, feedback of the operational amplifier 67 may delay. Therefore, operation speed is reduced, and waveform deformation or oscillation may be occurred. Accordingly, the low pass filter 39 is formed on the former step of the transistor 65.

In the device according to the third embodiment, the operational amplifier 67 controls the current flowing through the lamp 4 with the MOSFET 2 in such a manner that the input voltage of the operational amplifier 67 is equal to the drain voltage of the MOSFET 2. Thus, the increase of the load current is suppressed, and the noise is reduced.

Fourth Embodiment

Figure 9:
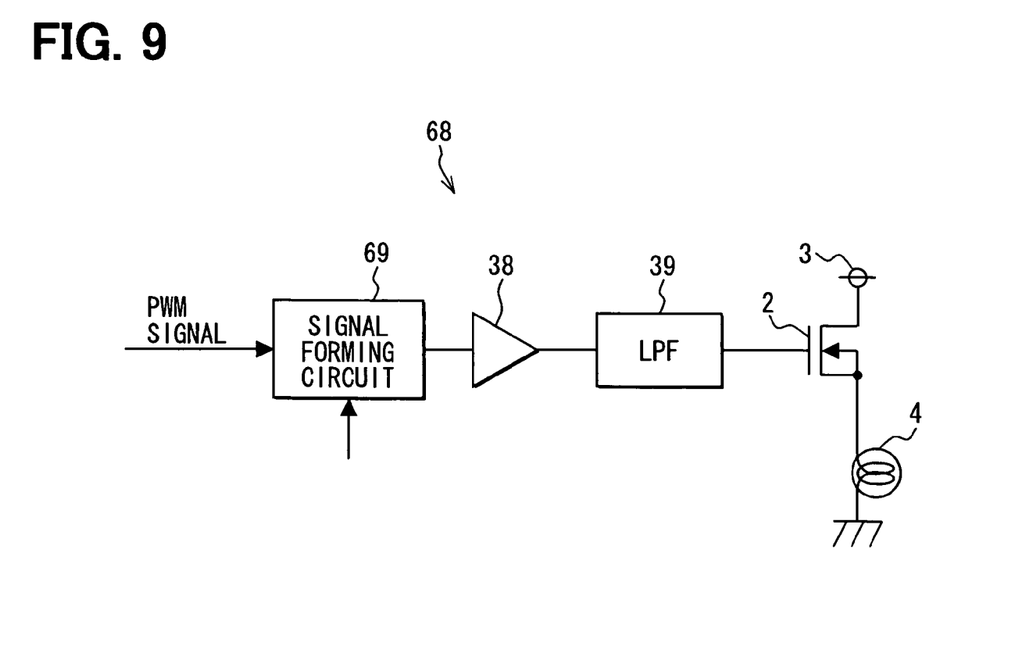
FIG. 9 is an electric diagram showing a driving device according to a fourth embodiment of the present invention.
Figure 10:
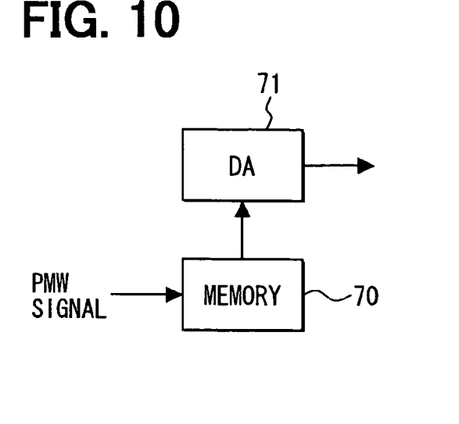
FIG. 10 is an electric diagram showing a sine wave forming circuit in the driving device according to the fourth embodiment.

FIGS. 9 and 10 show a driving device as a signal generator 68. The signal generator 68 includes a buffer 38 and a sine wave forming circuit 69. The output signal of the sine wave forming circuit 69 is inputted into the buffer 38. The sine wave forming circuit 69 forms the sine wave signal without monitoring the terminal voltage of the lamp 4. For example, the sine wave forming circuit 69 can be composed of a memory 70 and a D/A converter 71. The memory 70 as a waveform data memorizing circuit memorizes the sine wave data. The D/A converter 71 converts the sine wave data outputted from the memory 70 with D/A conversion. Similar to the second embodiment, the memory 70 starts to read the sine wave data as a trigger when the level of the PWM signal changes. The memory 70 proceeds a read address in the memory 70 in accordance with increase of a counter in an address counter.

The sine wave data outputted from the sine wave forming circuit 70 is converted by the D/A converter 71 with the D/A conversion. Thus, the control signal for proving the sine wave in the rising edge period and the down edge period is easily obtained.

Although the device includes the low pass filter 39, the device may include no low pass filter 39 if appropriately. Further, the sine wave forming circuit 69 may be the signal forming means 42 for performing the broken line approximation without referring to the terminal voltage of the lamp 4. In this case, the timing for switching multiple constant current power supplies between an on state and an off state may be a timing when a counter value of a timer counter becomes a predetermined value. The timer counter starts a count operation as a trigger of the PWM signal.

Fifth Embodiment

Figure 11:
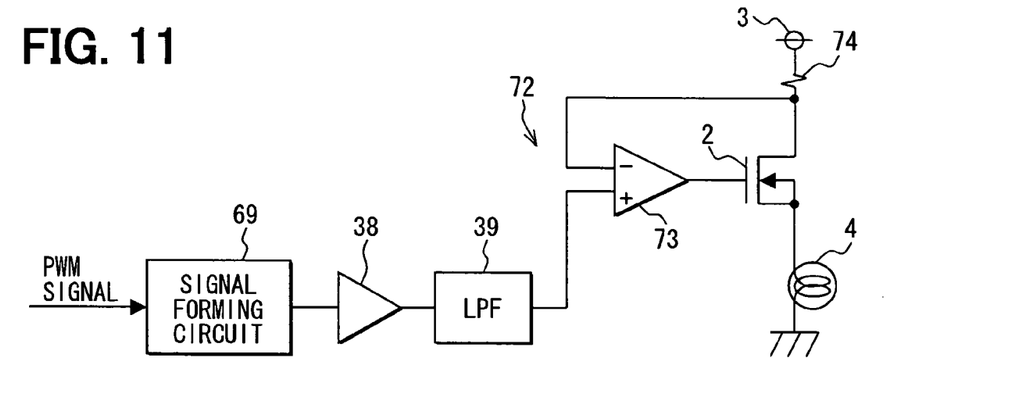
FIG. 11 is an electric diagram showing a sine wave forming circuit in a driving device according to a fifth embodiment of the present invention.

FIG. 11 shows a signal generator 72 according to a fifth embodiment of the present invention. The signal generator 72 includes the sine wave forming circuit 69. The output terminal of the low pass filter 39 is connected to the non-inversion input terminal of the operational amplifier 73. The inversion input terminal of the operational amplifier 73 is connected to the drain of the MOSFET 2. The output terminal of the operational amplifier 73 is connected to the gate of the MOSFET 2. A resistor 74 as current detecting means is formed between the drain of the MSFET 2 and the battery 3. Similar to the fourth embodiment, the signal generator 72 does not refer to (i.e., detect) the terminal voltage of the lamp 4. The operational amplifier 73 controls the current in such a manner that the output voltage of the low pass filter 39 is equal to the drain voltage of the MSFET 2. Accordingly, the driving current for the lamp 4 is restricted.

The sine wave forming circuit 69 may be the signal forming means 42 for performing the broken line approximation without referring to the terminal voltage of the lamp 4. In this case, the timing for switching multiple constant current power supplies between an on state and an off state may be a timing when a counter value of a timer counter becomes a predetermined value. The timer counter starts a count operation as a trigger of the PWM signal.

Six Embodiment

Figure 12:
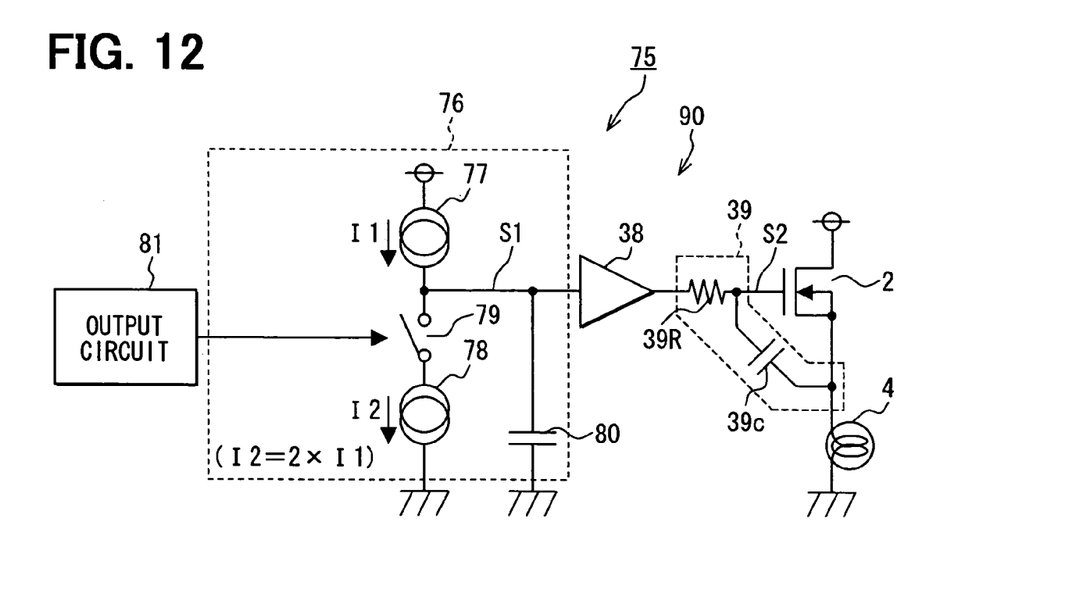
FIG. 12 is an electric diagram showing a driving device according to a sixth embodiment of the present invention.
Figure 13:
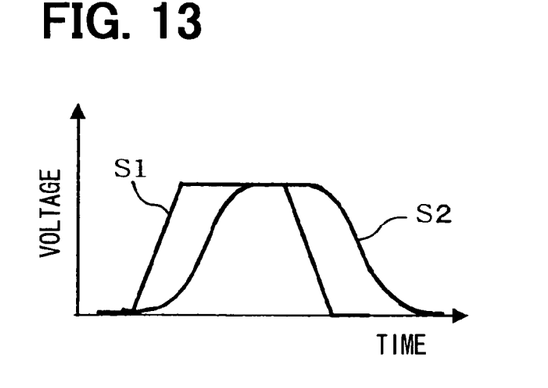
FIG. 13 is a graph showing a signal waveform in each of an input side of a buffer and a gate side of a FET, according to the sixth embodiment.

FIGS. 12 and 13 show a signal generator 75 according to a sixth embodiment of the present invention. The signal generator 75 includes a trapezoid waveform forming circuit 76 in place of the sine wave forming circuit 69 in FIG. 9. The gate signal of the MOSFET 2 is provided by a combination of the low pass filter 39 and the trapezoid waveform forming circuit 76.

The trapezoid waveform forming circuit 76 includes two constant current power supplies 77, 78, a switch 79 and a capacitor 80. The constant current power supplies 77, 78 are formed between a power source and a ground. The switch 79 is disposed between two constant current power supplies 77, 78. The capacitor 80 is formed between a common connection point between the constant current power supply 77 and the switch 79 and the ground. The constant current power supply 78 on the ground side flows the current, which is twice larger than the current of the constant current power supply 77 on the power source side. The switch 79 is controlled by a driving signal output circuit 81. The trapezoid waveform forming circuit 76 and the low pass filter 39 provide a signal forming circuit 90.

When the switch 79 is opened for switching the gate signal level from a low level to a high level. At this time, the constant current power supply 77 on the power source side charges the capacitor 80. On the other hand, when the switch 79 is closed for switching the gate signal level from the high level to the low level. At this time, the constant current power supply 78 on the ground side discharges the capacitor 80. Thus, a signal S1 having the trapezoid waveform shown in FIG. 13 is inputted into the input terminal of the buffer 38.

The low pass filter 39 is composed of a series resistor 39R and a capacitor 39C. The capacitor 39C is connected between the gate and the drain of the MOSFET 2. The signal S1 is filtered with the low pass filter 39 so that the waveform in the rising edge and the down edge of the signal S1 becomes smooth. Further, the timing of the output in the signal S1 delays. Thus, a signal S2 shown in FIG. 13 is obtained and inputted into the MOSFET 2.

Since the gate signal of the MOSFET 2 is generated by the combination of the trapezoid waveform forming circuit 76 and the lowpass filter 39, the waveform of the PWM signal has a smooth slope at the starting point and end point of each of the rising edge and the down edge. This signal is easily generated by the signal generator 75. Here, the low pass filter 39 is disposed on the output side of the trapezoid waveform forming circuit 76.

Seventh Embodiment

Figure 14:
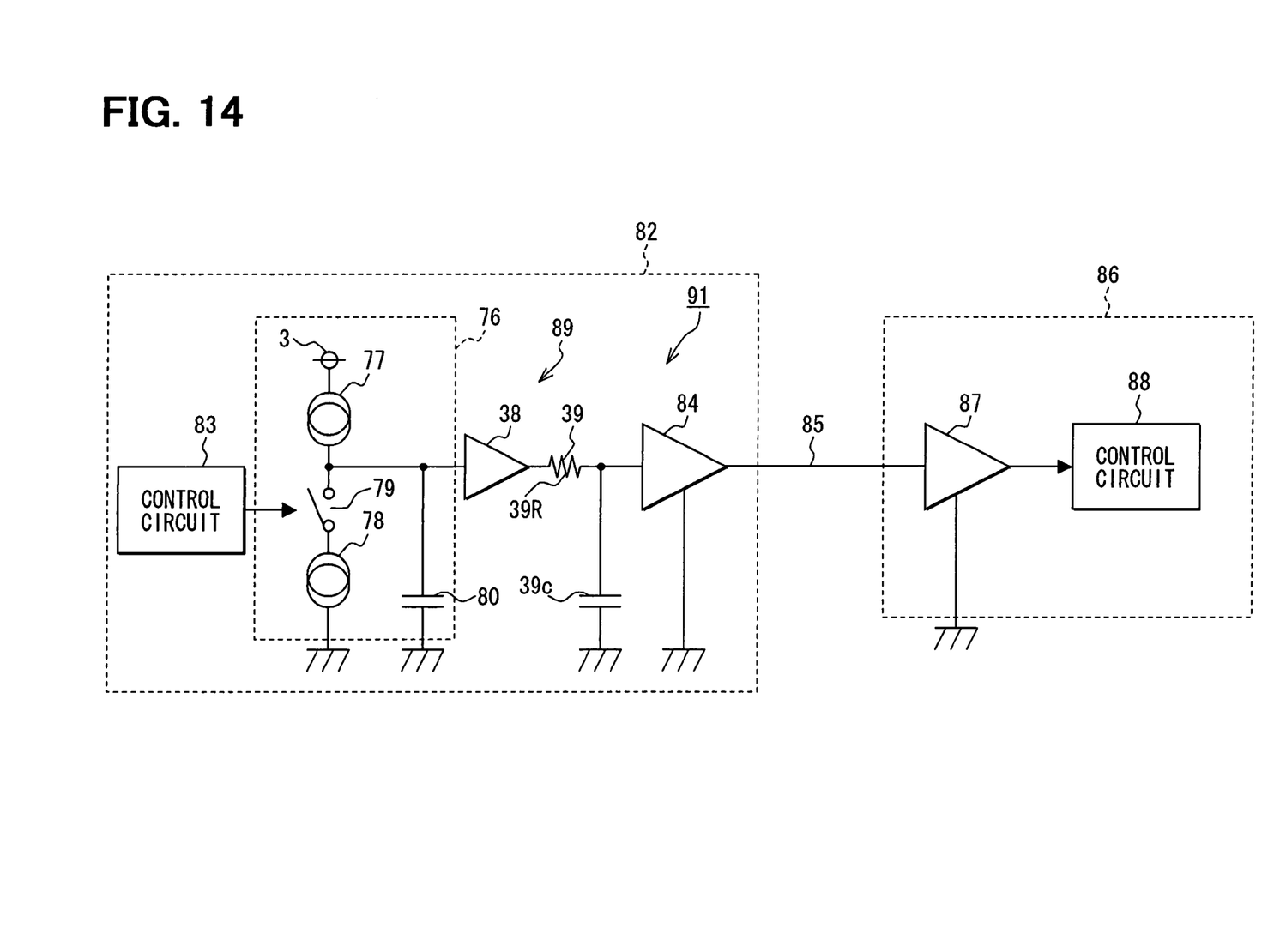
FIG. 14 is an electric diagram showing a communication system including a driving device according to a seventh embodiment of the present invention.

FIG. 14 shows a device including the signal generator 75 in FIG. 12. The device is used for a communication device. The device further includes a transmission node 82 and a reception node 86. On the transmission node side, the device includes a communication control circuit 83 instead of the driving signal output circuit 81. Further, the device includes a communication driver 84 as a signal output element instead of the MOSFET 2 and the lamp 4. The communication driver 84 is connected to the output side of the low pass filter 39.

The output terminal of the communication driver 84 is connected to the input terminal of a communication control circuit 88 on the reception node side through a communication wire 85 and a reception comparator 87. The trapezoid waveform forming circuit 76, the buffer 38 and the low pass filer 39 provide communication signal forming means 89. Further, the communication signal forming means 89 and the communication driver 84 provide a communication signal forming device 91 as a communication signal generator.

The signal waveform transmitting from the transmission node 82 to the reception node 86 through the communication wire 85 is substantially equal to the waveform of the signal S2 shown in FIG. 13. Accordingly, when the communication signal is switched between the high level and the low level, and transmitted with the high level or the low level repeatedly, the noise in the signal is reduced, and the switching loss in the communication driver 84 is improved.

Although the device including the signal generator 75 in FIG. 12, the device may include other signal forming means shown in FIGS. 1-11.

The present invention has the following aspects.

A signal generator includes a current control element for controlling a current flowing through an electric load, wherein the current control element is disposed between a direct current power supply and the electric load; and signal forming means for outputting a control signal to the current control element. The signal forming means generates the control signal in such a manner that the current flowing through the electric load has a rising edge and a down edge of a substantially sine waveform. The rising edge of the current is disposed at a timing when the current control element is switched on. The down edge of the current is disposed at a timing when the current control element is switched off.

In the above generator, the signal forming means outputs the control signal in such a manner that the current form of the current flowing through the electric load has a slope at the starting point and the end point in the rising edge and at the starting point and the end point in the down edge, the slope which smoothly changes with time. The rising edge and the down edge of the current appear at a timing when the current control element switches to turn on and off. Here, the slope with smoothly changing with time means that the waveform includes no rapid variation point, which is in differentiable with respect to time. Thus, the signal forming means generates the control signal having the waveform including no in differentiable variation point, so that the current control element is switched by the control signal. In this case, the generator achieves low noise level and low switching loss.

Further, a signal generator includes: a signal output element for generating and outputting a communication signal by means of a direct current power supply; and signal forming means for outputting a control signal to the signal output element. The signal forming means generates the control signal in such a manner that the communication signal has a smooth changing slope at a starting point and an ending point in a rising edge and at a starting point and an ending point in a down edge. The rising edge of the communication signal is disposed at a timing when the signal output element starts outputting. The down edge of the communication is disposed at a timing when the signal output element stops outputting.

In the above generator, the signal forming means outputs the control signal in such a manner that the waveform of the communication signal has a slope at the starting point and the end point in the rising edge and at the starting point and the end point in the down edge, the slope which smoothly changes with time. The rising edge and the down edge of the communication signal appear at a timing when the signal output element starts to output and stops to output. Here, the slope with smoothly changing with time means that the waveform includes no rapid variation point, which is in differentiable with respect to time. The signal output element outputs the communication signal for communication on the basis of the direct current power source. Thus, when the signal output element transmits the communication signal, which is changeable between the high level and the low level, a higher harmonic component in the communication signal can be eliminated, so that noise such as excess radiation is reduced. In this case, the generator achieves low noise level and low switching loss between the high level and the low level.

Alternatively, the signal forming means may include a low pass filter on an output side of the control signal. In this case, a higher harmonic component in the control signal is easily eliminated.

Alternatively, the signal forming means may include approximate-waveform forming means and a low pass filter. The approximate-waveform forming means generates and outputs the control signal, which has a predetermined waveform of a broken line approximation. The low pass filter filters a low frequency part of the control signal. In this case, the control signal capable of providing the communication signal having the slope which smoothly changes with time is easily generated.

Alternatively, the approximate-waveform forming means may include a capacitor. The capacitor is charged in a case where the control signal is in a rising edge period so that increase degree of a terminal voltage of the capacitor is switched with a plurality of steps. The capacitor is discharged in a case where the control signal is in a down edge period so that decrease degree of the terminal voltage of the capacitor is switched with a plurality of steps. The approximate-waveform forming means generates the control signal by switching the increase degree and the decrease degree of the terminal voltage with a plurality of steps. In this case, since the charge and discharge of the capacitor are controlled with multiple steps, the slope of the terminal voltage waveform is changed with multiple steps so that the control signal is approximated to be a predetermined broken line approximation.

Alternatively, the approximate-waveform forming means may switche to connect and disconnect between the capacitor and a plurality of constant current power supplies so that the increase degree and the decrease degree of the terminal voltage of the capacitor are switched with a plurality of steps. In this case, the charge and the discharge of the capacitor are easily controlled.

Alternatively, the approximate-waveform forming means may further include a plurality of comparators, each of which is capable of comparing a reference voltage and an output voltage of the signal output element. Connection and disconnection of the constant current power supplies are controlled in accordance with output voltages of the comparators. In this case, when the control signal outputted from the signal forming means controls the communication signal passing through the communication wire, the voltage of the communication wire is changed in accordance with the control signal. Thus, by referring to the increase degree and/or the decrease degree of the voltage, multiple constant current power supplies are appropriately controlled to connect and disconnect so that the control signal having a predetermined waveform is generated.

Alternatively, the approximate-waveform forming means may generate and output the control signal on the basis of a PWM signal. The approximate-waveform forming means further includes a discharge-purpose constant current power supply. The discharge-purpose constant current power supply is capable of flowing the current twice larger than a total of the currents of the constant current power supplies, each current of which is outputted to the capacitor. The discharge-purpose constant current power supply is connected to the capacitor in parallel. The discharge-purpose constant current power supply is active in a case where the PWM signal is in a low level. In this case, when the discharge-purpose constant current power supply is in-active, the charge current for charging the capacitor is a total of the current supplied from one or more constant current power supplies, which is connected to the capacitor. When the discharge-purpose constant current power supply is active, the discharge current for discharging the capacitor becomes twice larger than the total of the current supplied from one or more constant current power supplies, which is connected to the capacitor. Thus, the capacitor is discharged, so that the terminal voltage of the capacitor is reduced. Accordingly, the approximate waveform forming means can be provided by a small number of the constant current power supplies.

Alternatively, the signal forming means may include a waveform data memorizing circuit and a D/A converter. The waveform data memorizing circuit memorizes a data of a predetermined waveform having a predetermined rising edge and a predetermined down edge. The waveform data memorizing circuit reads and outputs the data corresponding to an address inputted into the waveform data memorizing circuit.

The D/A converter converts the data outputted from the waveform data memorizing circuit with D/A conversion. In this case, the control signal having a predetermined waveform can be formed easily.

Alternatively, the signal forming means includes a low pass filter, and the low pass filter filters a low frequency part of an analog signal outputted from the D/A converter. In this case, by filtering the D/A converted analog signal with the low pass filter, the waveform of the control signal in the rising edge period and in the down edge period become much smooth.

Alternatively, the signal forming means may include an A/D converter, reference data output means, a subtractor, an adder, a timing control portion, and a D/A converter. The A/D converter converts an output voltage with A/D conversion so that an A/D conversion data is obtained. The reference data output means outputs a reference waveform data corresponding to a predetermined rising edge and a predetermined down edge in the current. The subtractor calculates a difference between the A/D conversion data and the reference waveform data. The adder calculates addition of the difference to an output data, which is obtained in a previous cycle calculation. The timing control portion outputs the addition of the adder synchronizing with a PWM signal. The D/A converter converts an output data of the timing control portion with D/A conversion. In this case, the voltage detecting means detects the output voltage, and the difference between the output voltage data and the reference data is calculated. On the basis of the difference, a predetermined waveform is obtained. Therefore, even when characteristics of the signal output element are deviated, the noise in the communication signal is reduced.

Alternatively, the signal forming means may further include a multiplier. The multiplier multiplies the difference outputted from the subtractor by a predetermined factor, and an output data of the multiplier is inputted into the adder. In this case, when the factor of the multiplier is set to be smaller than "1," the control signal is stably outputted. Specifically, if the factor is larger than "1," the control signal outputted from the generator becomes much larger, so that the generator may oscillate.

Alternatively, the generator may further include: current detecting means for detecting the current flowing through a communication wire; and current control means for controlling the current flowing through the communication wire on the basis of the current detected by the current detecting means and the control signal generated by the signal forming means. In this case, the increase of the output current is controlled appropriately so that the noise is reduced.

Alternatively, the current detecting means may include a current detecting resistor disposed in a current path of the current flowing through the communication wire. The current control means includes an operational amplifier disposed between the signal forming means and the communication wire. The operational amplifier controls the communication signal outputted through the communication wire on the basis of the control signal and an electric potential corresponding to a voltage drop of the current detecting resistor. In this case, by using the operational amplifier, the output current is controlled.

Alternatively, the signal forming means may output the control signal in such a manner that a waveform of the control signal has a rising edge of a sine wave and a down edge of a sine wave. By forming the waveform at the rising edge and at the down edge to be a sine wave, the switching loss of the generator is sufficiently reduced. Thus, when the signal output element is operated by the control signal having the above waveform, the noise and the switching loss are much reduced.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A signal generator for use in driving current through a load, comprising:
    a current control element for controlling a current flowing through an electric load, wherein the current control element is disposed between a direct current power supply and the electric load; and
    a signal forming element for outputting a control signal to the current control element, wherein
    the signal forming element generates the control signal in such a manner that the current flowing through the electric load has a rising edge and a down edge of a substantially sine waveform,
    the rising edge of the current is disposed at a timing when the current control element is switched on, and
    the down edge of the current is disposed at a timing when the current control element is switched off,
    wherein
    the signal forming element includes approximate-waveform forming means and a low pass filter,
    the approximate-waveform forming means generates and outputs the control signal, which has a predetermined waveform of a broken line approximation,
    the low pass filter filters a low frequency part of the control signal,
    the approximate-waveform forming means includes a capacitor,
    the capacitor is charged in a case where the control signal is in a rising edge period so that increase degree of a terminal voltage of the capacitor is switched with a plurality of steps,
    the capacitor is discharged in a case where the control signal is in a down edge period so that decrease degree of the terminal voltage of the capacitor is switched with a plurality of steps, and
    the approximate-waveform forming means generates the control signal by switching the increase degree and the decrease degree of the terminal voltage with a plurality of steps.

2. The signal generator according to claim 1, wherein
    the approximate-waveform forming means switches to connect and disconnect between the capacitor and a plurality of constant current power supplies so that the increase degree and the decrease degree of the terminal voltage of the capacitor are switched with a plurality of steps.

3. The signal generator according to claim 2, wherein
    the approximate-waveform forming means further includes a plurality of comparators, each of which is capable of comparing a reference voltage and an output voltage of the current control element, and
    connection and disconnection of the constant current power supplies are controlled in accordance with an output voltage of the comparators.

4. The signal generator according to claim 3, wherein
the approximate-waveform forming means generates and outputs the control signal on the basis of a PWM signal,
the approximate-waveform forming means further includes a discharge-purpose constant current power supply,
the discharge-purpose constant current power supply is capable of flowing the current twice larger than a total of the currents of the constant current power supplies, each current of which is outputted to the capacitor,
the discharge-purpose constant current power supply is connected to the capacitor in parallel, and
the discharge-purpose constant current power supply is active in a case where the PWM signal is in a low level.

* * * * *